US006593814B2

(12) United States Patent
Donig

(10) Patent No.: US 6,593,814 B2
(45) Date of Patent: Jul. 15, 2003

(54) AMPLIFIER CIRCUIT WITH PROTECTIVE DEVICE

(75) Inventor: Günter Donig, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/950,438

(22) Filed: Sep. 10, 2001

(65) Prior Publication Data

US 2002/0067210 A1 Jun. 6, 2002

(30) Foreign Application Priority Data

Sep. 8, 2000  (DE) ......................................... 100 44 452

(51) Int. Cl.$^7$ ................................................. H03F 1/52

(52) U.S. Cl. .................................... 330/298; 330/207 P

(58) Field of Search ............................ 330/298, 207 P; 455/115, 117

(56) References Cited

U.S. PATENT DOCUMENTS

| 4,353,037 A | | 10/1982 | Miller ......................... 330/298 |
| 5,412,341 A | * | 5/1995 | Walczak ...................... 330/279 |
| 5,450,036 A | * | 9/1995 | Nishioka et al. ............. 330/297 |
| 5,812,024 A | * | 9/1998 | Mastrocola .................. 330/289 |
| 6,218,904 B1 | * | 4/2001 | Panther ....................... 330/296 |

* cited by examiner

Primary Examiner—Robert Pascal
Assistant Examiner—Khanh Van Nguyen
(74) Attorney, Agent, or Firm—Laurence A. Greenberg; Werner H. Stemer; Ralph E. Locher

(57) ABSTRACT

An amplifier circuit having an amplifier stage is specified, in which, in order to avoid breakdown effects in the transistors thereof, an in-phase regulator is provided which, on the load side, is connected on the one hand to the amplifier stage and on the other hand to a reference-ground potential terminal, and which limits the voltage dropped across the amplifier stage. The in-phase regulator on the reference-ground potential side also enables the use of standard components at high supply voltages. The amplifier circuit can be used for example as a radio frequency output stage.

8 Claims, 2 Drawing Sheets

AMPLIFIER CIRCUIT WITH PROTECTIVE DEVICE

BACKGROUND OF THE INVENTION

Field of the Invention

The present invention relates to an amplifier circuit.

Output stages are realized using bipolar transistors in radio frequency technology, for example.

For transistors, various limiting data which must not be exceeded are specified, such as, for example in the case of bipolar transistors, the emitter-base reverse voltage, the maximum permissible collector-emitter voltage and also the collector-base reverse voltage. By way of example, if the maximum permissible collector-emitter voltage is exceeded on account of a high supply voltage, then undesirable breakdown effects occur. In this case, significantly larger currents flow with a reduced output power. These breakdown effects have the disadvantage that the breakdown, as soon as it is initiated, no longer cuts off.

Consequently, there is a requirement that the operating voltage must lie below the maximum permissible collector-emitter voltage in every operating state. If the operating voltage is prescribed, for example by the battery voltage of a portable device, and may vary for example depending on the charged state of the battery, then it is necessary to upgrade the amplifier circuit for higher supply voltages.

It is conceivable, for example, to use power transistors with a higher collector-emitter breakdown voltage. However, these have the disadvantage of requiring complex process modifications in production and can only be realized with a significantly larger chip area in conjunction with a lower performance, in particular lower efficiency.

U.S. Pat. No. 4,353,037 specifies a protection circuit for a transmitter amplifier, wherein the gain of the amplifier is regulated in order to avoid mismatches thereof.

SUMMARY OF THE INVENTION

It is accordingly an object of the invention to provide an amplifier circuit that overcomes the above-mentioned disadvantages of the prior art devices of this general type, which is suitable for higher supply voltages, in which the breakdown effects outlined are avoided, and which can be realized using standard transistors without an increased maximum permissible collector-emitter voltage $U_{CE0}$.

With the foregoing and other objects in view there is provided, in accordance with the invention, an amplifier circuit containing a reference-ground potential terminal and an amplifier stage having an input for receiving a signal to be amplified, an output at which an amplified signal can be drawn off, and a reference node. An in-phase regulator having an input side for receiving a regulating voltage, a load side having a first end connected to the reference node and a second end connected to the reference-ground potential terminal, is provided. The in-phase regulator reduces a DC voltage dropped across the amplifier stage between the output and the reference node. A voltage regulator is provided and has a supply potential terminal for receiving a supply potential and an output outputting the regulating voltage received by the in-phase regulator. The regulating voltage has a fixed potential difference with respect to the supply potential.

According to the invention, the in-phase regulator is provided on the reference-ground potential side, that is to say on the ground side on an amplifier stage, for example on a radio frequency output stage. As a result of this, depending on the regulating voltage, the voltage that is dropped across the amplifier stage and depends on the supply voltage can be reduced, with the result that no breakdown effects occur in transistors of the amplifier circuit. Since the voltage dropped across the transistors of the amplifier stage is reduced, high-voltage bipolar or high-voltage CMOS technology is not required, with the result that the amplifier circuit described can be produced with little complexity, a small area requirement and cost-effectively. Nevertheless, there is a large modulation range available for the operating frequency of the amplifier stage, which may be a high frequency. This may be governed at least partly by parasitic transistor capacitances.

Furthermore, in accordance with the present principle, a voltage regulator is provided, which is connected to a supply potential terminal and provides the regulating voltage at its output, the regulating voltage having a fixed potential difference with respect to the supply potential. The voltage regulator forms a fixed potential difference between the supply potential, which also supplies the amplifier stage, and the potential at the reference node. The voltage regulator can consequently be used to set the maximum voltage dropped across the amplifier stage, with the result that it is thereby ensured that a voltage that is higher than the maximum permissible collector-emitter voltage is not dropped across the amplifier stage. In contrast, if the supply voltage is lower than the fixedly set potential difference, which is a fixed maximum potential difference, then the controllable resistor requires a low resistance and draws the reference node practically to reference-ground potential in DC voltage terms.

Consequently, the present circuit limits the voltage dropped across the output stage of an amplifier to a maximum value.

In one advantageous embodiment of the present invention, the in-phase regulator has a resistor, which can be controlled by the regulating voltage, and is connected on the one hand to the reference node and on the other hand to the reference-ground potential terminal. This has the advantage of power-free control.

In a further advantageous embodiment of the present invention, the controllable resistor is a MOS transistor. N-channel transistors, in particular, make it possible to realize the in-phase regulator with a low residual voltage, i.e. that at a low supply voltage of the amplifier stage, only a very low voltage magnitude is dropped across the load path of the MOS transistor, the load path having a low impedance in this case. On account of parasitic capacitances in the transistor, the reference node is virtually at reference-ground potential for the operating frequency even at a high supply voltage. The power-free driving of the MOS transistor makes it possible to use a regulator circuit with a low current demand.

In a further advantageous embodiment of the present invention, a regulating loop is formed in the in-phase regulator, the regulating loop containing a first operational amplifier, to which the regulator voltage can be fed at its inverting input and which is connected to the reference node by its non-inverting input, an output of the first operational amplifier being coupled to a control input of the controllable resistor for the control of the latter. The regulating loop described realizes a voltage follower in which the potential at the reference node follows the potential at the inverting input of the first operational amplifier, i.e. the regulating voltage.

In a further advantageous embodiment of the present invention, a loop filter is provided between the output of the first operational amplifier and the control input of the controllable resistor. The loop filter enables stable operation of the regulating loop with a sufficient phase margin even when the first operational amplifier is a non-ideal operational amplifier.

In a further advantageous embodiment of the present invention, for the purpose of voltage regulation, a second operational amplifier is provided, to which a reference signal can be fed at its non-inverting input, whose output is fed back to its inverting input, and whose inputs are coupled to the supply potential terminal. A regulating voltage that is fixedly related to the supply potential can be provided in a simple manner by the second operational amplifier.

In a further advantageous embodiment of the present invention, for the purpose of voltage regulation, a further controllable resistor is provided, whose control input is connected to the output of the second operational amplifier and via whose controlled path, which is connected to the reference-ground potential terminal at one end, the regulating voltage can be drawn off.

If the controllable resistor is a MOS transistor, for example, then it is possible to operate the voltage regulation with a very small residual voltage, with the result that, at a low supply voltage, the regulating voltage potential which can be fed to the inverting input of the first operational amplifier can be reduced to virtually reference-ground potential.

In a further advantageous embodiment of the present invention, a resonant circuit is connected between the reference node and the reference-ground potential terminal. The resonant circuit provides improved linking of the reference node with low impedance to the reference-ground potential for the operating frequency of the amplifier stage. The amplifying properties of the amplifier circuit can be improved as a result of this.

In a further advantageous embodiment of the present invention, the resonant circuit has an inductance in series with a capacitance. In this case, the capacitance can be produced in a simple manner by an external capacitor which is connected to the reference node via a bonding wire which realizes the inductance.

In accordance with an added feature of the invention, an inductive transformer is provided and connected to the input of the amplifier stage. The inductive transformer converts a common-mode signal present on an input side into a single-ended signal for driving the amplifier stage.

Other features which are considered as characteristic for the invention are set forth in the appended claims.

Although the invention is illustrated and described herein as embodied in an amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
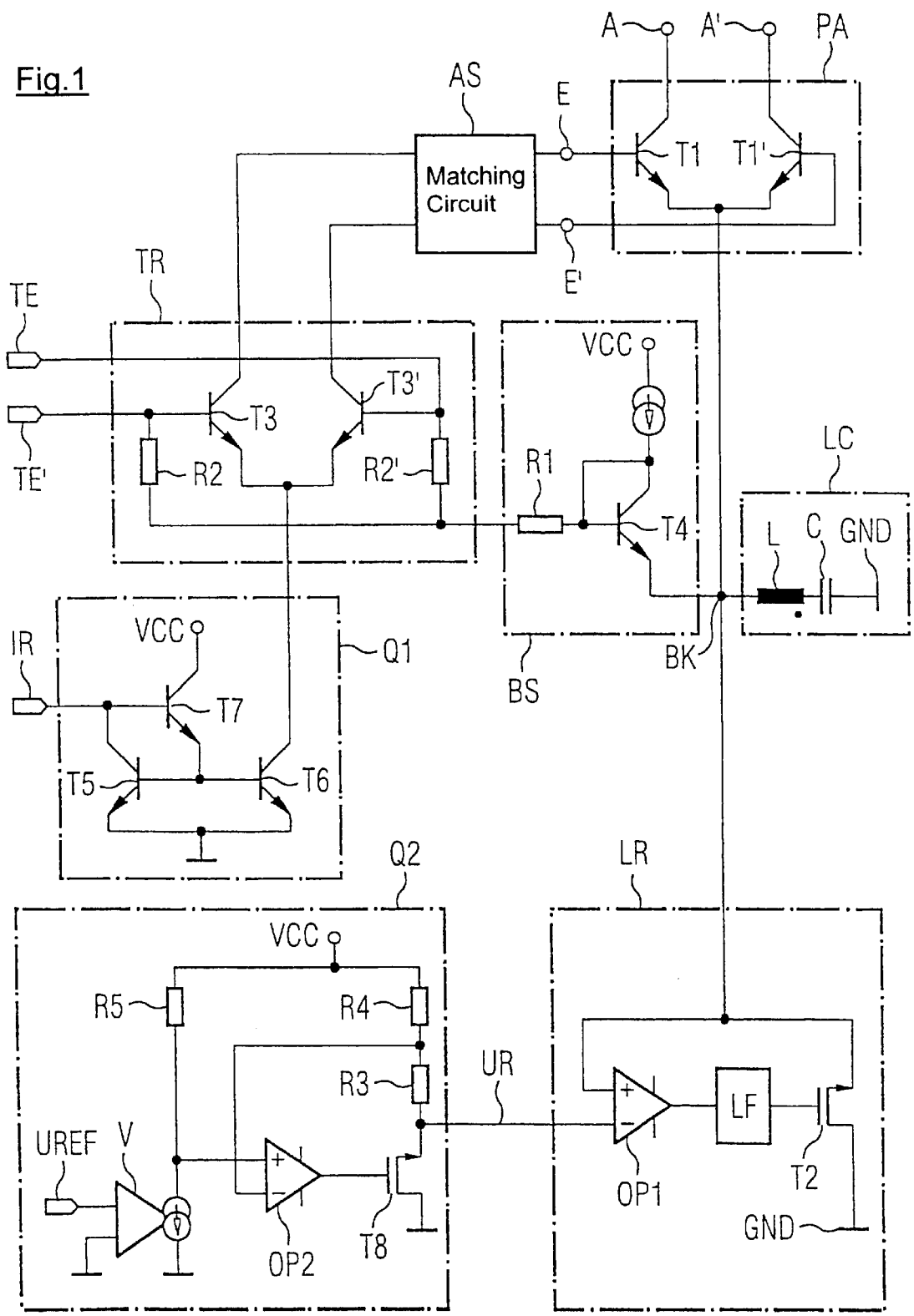
FIG. 1 is a block circuit diagram of an exemplary realization of an amplifier circuit according to the invention.

In all the figures of the drawing, sub-features and integral parts that correspond to one another bear the same reference symbol in each case. Referring now to the figures of the drawing in detail and first, particularly, to FIG. 1 thereof, there is shown an amplifier stage PA, with a driver stage TR connected upstream of it. In order to link the driver stage TR to a reference node BK in potential terms, a bias circuit BS is provided. Furthermore, an in-phase regulator LR is connected to the reference node BK, and is additionally connected to a reference-ground potential GND. The in-phase regulator LR has a controllable resistor which is embodied as a MOS transistor T2 and is connected on the one hand to the reference node BK and on the other hand to the reference-ground potential terminal GND.

In order to obtain the full modulation range of the amplifier stage PA even when the parasitic capacitances present in the in-phase regulator LR do not suffice for the desired linking of the reference node BK to reference-ground potential GND, the linking existing with regard to the operating frequency, provision is made of a resonant circuit LC having an inductance L, which is connected on the one hand to the reference node BK and on the other hand to a capacitance C, which is coupled to the reference-ground potential terminal GND.

FIG. 1 shows a circuit that is suitable for amplifying differential signals. For this purpose, both the driver stage TR and the amplifier stage PA are of a balanced configuration, two third emitter-coupled transistors T3, T3' are provided in the driver stage TR and two first emitter-coupled transistors T1, T1' are provided in the amplifier stage PA. A matching circuit AS is provided between the driver stage TR and the amplifier stage PA, and is suitable for matching impedances and voltage levels. The MOS transistor T2 operated as a controllable resistor is connected to the emitters of the first transistors T1, T1' and is furthermore connected to the reference-ground potential terminal GND. For the purpose of power-free regulation of the gate potential of the second transistor T2, the in-phase regulator LR has a first operational amplifier OP1, to which the potential of the reference node BK can be fed at its non-inverting input and a regulating voltage UR can be fed at its inverting input. The gate of the second transistor T2 is coupled to the output of the first operational amplifier OP1 by a loop filter LF. In this case, the loop filter LF serves for providing a stable regulating loop which has a sufficient phase margin. Overall, a voltage follower in which the potential at the reference node BK follows that of the regulating voltage UR is formed with the regulating loop in the in-phase regulator LR.

A voltage source Q2 for providing a regulating voltage UR has a second operational amplifier OP2, whose non-inverting input is coupled to a terminal for feeding a reference voltage UREF, for example a bandgap voltage, and also via a fifth resistor R5 to the supply potential VCC. The inverting input is connected via a fourth resistor R4 likewise to the supply potential terminal VCC and also via a third resistor R3 on the one hand to a controlled path of an eighth transistor T8, which is connected to the reference-ground potential terminal GND. In this case, the output of the second operational amplifier OP2 is connected to the gate terminal of the eighth transistor. Furthermore, an amplifier V is provided for feeding a reference voltage UREF to the second operational amplifier OP2.

The regulating voltage UR provided by the voltage source Q2 can lie below the supply potential VCC at most by a voltage magnitude which can be set by the third resistor R3 and the fourth resistor R4, and results from the quotient of the sum of the third and fourth resistances and the current flowing through them. If the supply voltage impressed on the supply potential terminal VCC is slowly increased proceeding from the reference-ground potential GND, then initially the regulating voltage UR and the reference-ground potential GND are practically identical. Only when the voltage at the supply potential terminal VCC exceeds a specific value, which is adjustable and depends on the maximum permissible collector-emitter voltage of the amplifier stage PA to be protected and the driver stage TR, are the regulating voltage UR and the voltage at the reference-ground potential GND different, the fixed voltage magnitude dropping between the reference-ground potential VCC and the regulating voltage UR. Consequently, the regulating voltage UR and thus, via the voltage follower in the in-phase regulator LR, also the reference node BK are linked to the supply potential VCC in potential terms. Consequently, only an adjustable maximum voltage magnitude can be dropped across the amplifier stage PA, which is coupled to the supply potential terminal VCC by its outputs A, A'. Accordingly, breakdown effects in the first transistors T1, T1' in the amplifier stage PA can be effectively prevented.

Configuring the eighth transistor T8 as an N-channel MOS transistor has the advantage that, at low supply potential VCC, the regulating voltage UR can be reduced practically down to reference-ground potential GND and only a very low residual voltage is dropped across the eighth transistor T8 on the load side. This requires the so-called on resistance of the eighth transistor T8 to be small relative to the sum of the third and fourth resistances. In this case, N-channel transistors have the additional advantage of the small area requirement.

The bias stage BS and a current source Q1 are provided for operating the driver stage TR. The current source Q1, to which a reference current IR can be fed and which is connected to the reference-ground potential terminal VCC, represents the current source which is required for a differential amplifier stage T3, T3' realized in the driver stage TR and is connected to the two emitter terminals of the third transistors T3, T3'. The bias stage BS provides a respective bias voltage for the third transistors T3, T3', at the base terminals thereof, and has a fourth transistor T4, which is coupled on the one hand to the reference node BK and on the other hand to the supply potential VCC and also via a first resistor R1 and second resistors R2, R2' to the driver stage TR.

In order to obtain high gain factors at the outputs A, A' of the amplifier stage PA when a high-frequency input signal is applied to the inputs TE, TE' of the driver stage TR, the resonant circuit LC is connected to the reference node BK. The resonant circuit LC has the inductance L in series with the capacitance C, and is connected to the reference-ground potential terminal GND. In this case, the capacitance C may be an external capacitance, and the inductance L may be realized by a bonding wire for connecting the reference node BK to the external capacitance C. The resonant circuit LC can be obviated provided that the parasitic capacitances in the in-phase regulator LR suffice to enable linking of the reference node BK to the reference-ground potential GND for the operating frequency of the amplifier circuit which can be applied to the inputs TE, TE'.

Both the second transistor T2 and the eighth transistor T8 are realized as N-channel MOS transistors. Therefore, small residual voltages dropped across the transistors T2, T8 on the load side can be achieved for low supply voltages, with the result that the amplifier stage PA has good amplifying properties even at low supply voltages.

With the circuit described, which has an in-phase regulator LR on the reference-ground potential side, it is possible to use standard components in the amplifier stage without breakdown effects occurring on account of high supply voltages. Using standard components and dispensing with high-voltage technologies enable a cost-effective circuit realization with a small chip area in conjunction with little complexity. Since the reference node BK is at reference-ground potential for the operating frequency of the amplifier stage, in particular during operation as a radio frequency amplifier stage, the amplifier stage PA has good amplifying properties and also a large modulation range. Using an N-channel transistor T2 in the in-phase regulator LR enables power-free driving of the transistor T2 by its gate voltage. The circuit can be realized using a BiCMOS technology, in which case, in addition to the small-signal circuits required for an amplifier circuit, it is also possible for the amplifier stage PA, configured as a radio frequency output stage, to be integrated into a large scale integration production process.

The circuit described can advantageously be realized with a small area requirement and cost-effectively since a standard BiCMOS technology can be used.

Moreover, the power-free driving of the MOS transistors T2, T8 makes it possible to drive them with a low current demand.

Figure 2:
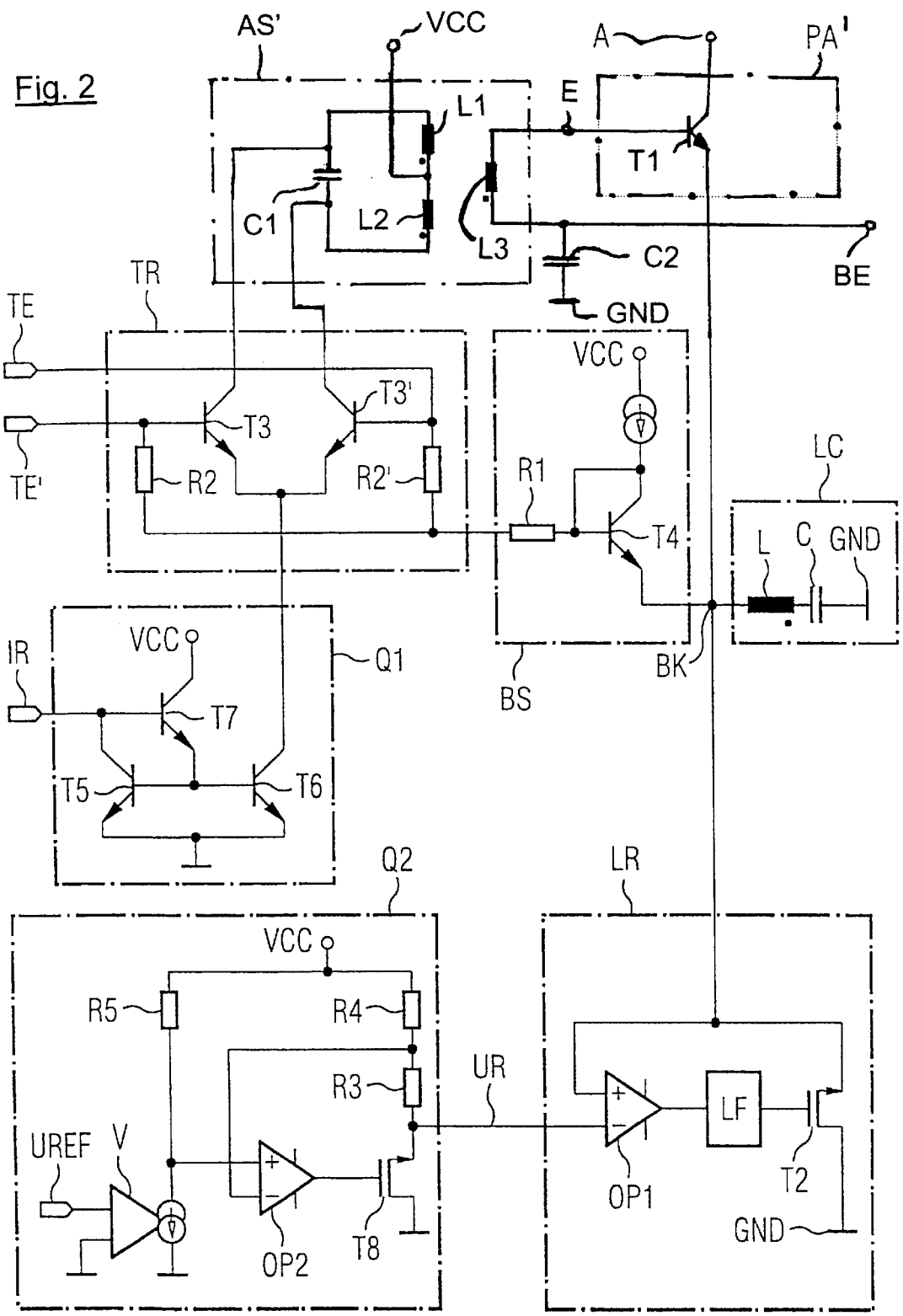
FIG. 2 is a block circuit diagram of a development of the exemplary embodiment of FIG. 1 with a single-ended output.

FIG. 2 shows a development of the simplified circuit diagram of the amplifier circuit in accordance with FIG. 1. In contrast to the circuit in accordance with FIG. 1, the amplifier circuit in accordance with FIG. 2 is configured for a single-ended output signal.

The circuit in accordance with FIG. 2 largely corresponds in construction and function to the circuit in accordance with FIG. 1 and differs from the latter merely with regard to the amplifier stage, which is designated by PA' in FIG. 2, and with regard to the matching circuit which is connected upstream of the amplifier stage PA', is designated matching circuit AS' in FIG. 2 and couples the input driver stage TR to the output stage PA'.

The amplifier stage PA' has a bipolar transistor T1, configured as a pnp power transistor, having an emitter terminal, which is connected to the reference node BK, having a collector terminal, which is coupled to the single-ended output A of the amplifier circuit, and having a base terminal, which is connected to the input E of the amplifier stage PA'.

For coupling the balanced signal output of the driver stage TR to the single-ended input E of the amplifier stage PA', the matching circuit AS' has an integrated transformer L1, L2, L3. The transformer has a primary side, which has a series circuit containing two inductances L1, L2, and a secondary side, which has an inductance L3. The series circuit L1, L2 of the primary side is connected to the balanced output of the driver stage TR. The common circuit node of the two inductances L1, L2 of the primary side of the transformer is connected to a supply potential terminal VCC. A parallel capacitor C1 connected in parallel with the series circuit formed by the inductances L1, L2 brings about an improvement in the frequency response of the transformer. The input E of the amplifier stage PA' which input is connected to the secondary side of the transformer, is connected to one terminal of the inductance L3, to whose other terminal a quiescent current for feeding the power transistor T1 can be fed at a bias input BE. The bias input BE is furthermore connected to the reference-ground potential terminal GND via a capacitor C2. The integrated transformer L1, L2, L3 combines the common-mode signal of the input stage TR to form a single-ended signal. The transformer L1 to L3 can be realized in a simple manner using the three metallization layers present in customary semiconductor fabrication techniques. The output stage PA' only contains the power transistor T1. Overall, the circuit in accordance with FIG. 2 affords a simplified external circuitry by comparison with the circuit of FIG. 1, since a single-ended signal and no common-mode signal is present at the output A.

The advantageous mode of operation of the voltage limiting for protecting the transistor T1 against a breakdown corresponds, as already mentioned, in construction and function to that of FIG. 1.

I claim:

1. An amplifier circuit, comprising:

a reference-ground potential terminal;

an amplifier stage having an input for receiving a signal to be amplified, an output at which an amplified signal can be drawn off, and a reference node;

an in-phase regulator having an input side for receiving a regulating voltage, a load side having a first end connected to said reference node and a second end connected to the reference-ground potential terminal, said in-phase regulator reducing a DC voltage dropped across said amplifier stage between said output and said reference node;

said in-phase regulator having a controllable resistor controlled by the regulating voltage, said controllable resistor having a first end connected to said reference node on said load side, a second end connected to said reference-ground potential terminal, and a control input;

said in-phase regulator further having a regulating loop containing an operational amplifier having an inverting input receiving the regulating voltage, a non-inverting input connected to said reference node, and an output coupled to said control input of said controllable resistor for controlling said controllable resistor; and a voltage regulator having a supply potential terminal for receiving a supply potential and an output outputting the regulating voltage received by said in-phase regulator, the regulating voltage having a fixed potential difference with respect to the supply potential.

2. The amplifier circuit according to claim 1, wherein said controllable resistor is a MOS transistor.

3. The amplifier circuit according to claim 1, wherein said in-phase regulator has a loop filter connected between said output of said operational amplifier and said control input of said controllable resistor.

4. The amplifier circuit according to claim 1, wherein said voltage regulator has a further operational amplifier with a non-inverting input for receiving a reference signal, an inverting input, and an output feeding back to said inverting input, and said non-inverting input and said inverting input are coupled to said supply potential terminal.

5. An amplifier circuit, comprising:

a reference-ground potential terminal;

an amplifier stage having an input for receiving a signal to be amplified, an output at which an amplified signal can be drawn off, and a reference node;

an in-phase regulator having an input side for receiving a regulating voltage, a load side having a first end connected to said reference node and a second end connected to the reference-ground potential terminal, said in-phase regulator reducing a DC voltage dropped across said amplifier stage between said output and said reference node; and a voltage regulator having a supply potential terminal for receiving a supply potential and an output outputting the regulating voltage received by said in-phase regulator, the regulating voltage having a fixed potential difference with respect to the supply potential;

said voltage regulator further having an operational amplifier with a non-inverting input for receiving a reference signal, an inverting input, and an output fed back to said inverting input, and said non-inverting input and said inverting input being coupled to said supply potential terminal, and a controllable resistor with a control input connected to said output of said operational amplifier and a controlled path having a first end connected to said reference-ground potential terminal and a second end where the regulating voltage can be drawn off.

6. An amplifier circuit, comprising:

a reference-ground potential terminal;

an amplifier stage having an input for receiving a signal to be amplified, an output at which an amplified signal can be drawn off, and a reference node;

an in-phase regulator having an input side for receiving a regulating voltage, a load side having a first end connected to said reference node and a second end connected to the reference-ground potential terminal, said in-phase regulator reducing a DC voltage dropped across said amplifier stage between said output and said reference node;

a resonant circuit connected between said reference node and said reference-ground potential terminal; and a voltage regulator having a supply potential terminal for receiving a supply potential and an output outputting the regulating voltage received by said in-phase regulator, the regulating voltage having a fixed potential difference with respect to the supply potential.

7. An amplifier circuit, comprising:

a reference-ground potential terminal;

an amplifier stage having an input for receiving a signal to be amplified, an output at which an amplified signal can be drawn off, and a reference node;

an inductive transformer connected to said input of said amplifier stage, said inductive transformer converting a common-mode signal present on an input side into a single ended signal for driving said amplifier stage;

an in-phase regulator having an input side for receiving a regulating voltage, a load side having a first end connected to said reference node and a second end connected to the reference-ground potential terminal, said in-phase regulator reducing a DC voltage dropped across said amplifier stage between said output and said reference node; and a voltage regulator having a supply potential terminal for receiving a supply potential and an output outputting the regulating voltage received by said in-phase regulator, the regulating voltage having a fixed potential difference with respect to the supply potential.

8. An amplifier circuit, comprising:

a reference-ground potential terminal;

an amplifier stage having an input for receiving a signal to be amplified, an output at which an amplified signal can be drawn off, and a reference node;

an in-phase regulator having an input side for receiving a regulating voltage, a load side having a first end connected to said reference node and a second end connected to the reference-ground potential terminal, said in-phase regulator reducing a DC voltage dropped across said amplifier stage between said output and said reference node; and a voltage regulator having a supply potential terminal for receiving a supply potential and an output outputting the regulating voltage received by said in-phase regulator and at least one resistor coupling said output to the supply potential, the regulating voltage having a fixed potential difference with respect to the supply potential.

* * * * *